(12) United States Patent
Yang (10) Patent No.: US 11,495,622 B2
(45) Date of Patent: Nov. 8, 2022

(54) DISPLAY PANEL, MANUFACTURE METHOD AND DISPLAY APPARATUS

(71) Applicant: HKC CORPORATION LIMITED, Shenzhen (CN)

(72) Inventor: Chunhui Yang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 747 days.

(21) Appl. No.: 16/342,205

(22) PCT Filed: Nov. 29, 2018

(86) PCT No.: PCT/CN2018/118157
§ 371 (c)(1),
(2) Date: Apr. 16, 2019

(87) PCT Pub. No.: WO2020/093487
PCT Pub. Date: May 14, 2020

(65) Prior Publication Data
US 2021/0327905 A1    Oct. 21, 2021

(30) Foreign Application Priority Data
Nov. 9, 2018   (CN) .......................... 201811332879.4

(51) Int. Cl.
*H01L 27/12* (2006.01)
*G02F 1/1362* (2006.01)

(52) U.S. Cl.
CPC ...... *H01L 27/124* (2013.01); *G02F 1/136286* (2013.01); *G02F 1/136295* (2021.01)

(58) Field of Classification Search
CPC ......... G02F 1/136286; G02F 1/136295; H01L 27/124; H01L 27/1244; H01L 27/3276; H01L 27/3279
(Continued)

(56) References Cited

U.S. PATENT DOCUMENTS 9,927,661 B2    3/2018  Park et al.

FOREIGN PATENT DOCUMENTS

| CN | 101055353 A | 10/2007 |
|----|-------------|---------|
| CN | 103730508 A | 4/2014  |

(Continued)

OTHER PUBLICATIONS

International Search Report issued in corresponding International application No. PCT/CN2018/118157, dated Aug. 7, 2019 (6 pages).

(Continued)

*Primary Examiner* — Peter M Albrecht (57) ABSTRACT

The present application discloses a display panel, a manufacture method and a display apparatus. The display panel includes a first substrate; the first substrate includes a base, a first metal layer, an insulating layer and a second metal layer; the second metal layer includes horizontal zones and oblique zones; each of the oblique zones is inclined from a first height to a second height; the first height is greater than the second height; a thickness of each of the horizontal zones of the second metal layer is greater than a thickness of each of the oblique zones of the second metal layer; and a width of each of the oblique zones of the second metal layer is greater than a width of each of the horizontal zones of the second metal layer.

11 Claims, 6 Drawing Sheets

(58) Field of Classification Search
USPC .......................................................... 345/204
See application file for complete search history.

(56) References Cited

FOREIGN PATENT DOCUMENTS

| | | | |
|---|---|---|---|
| CN | 104460150 A | 3/2015 | |
| CN | 104977736 A | 10/2015 | |
| CN | 106654047 A | 5/2017 | |
| JP | S60236266 A | 11/1985 | |
| WO | WO-2009116177 A1 * | 9/2009 | ......... H01L 27/3276 |

OTHER PUBLICATIONS

First Office Action from China patent office in a counterpart Chinese patent Application 201811332879.4, dated Apr. 3, 2020 (7 pages).
Written Opinion of the International Searching Authority for No. PCT/CN2018/118157.

* cited by examiner

FIG. 10

DISPLAY PANEL, MANUFACTURE METHOD AND DISPLAY APPARATUS

The present application claims priority to the Chinese Patent Application No. CN201811332879.4, filed with the Chinese Patent Office on Nov. 9, 2018, and entitled "DISPLAY PANEL, MANUFACTURE METHOD AND DISPLAY APPARATUS", which is incorporated herein by reference in its entirety.

TECHNICAL FIELD

The present application relates to the technical field of display, and in particular to a display panel, a manufacture method and a display apparatus.

BACKGROUND

The statements in this section merely provide background information related to the present application and may not constitute prior art.

In a Thin Film Transistor-Liquid Crystal Display (TFT-LCD), an array manufacture engineering is a key engineering to implement electrical drive of a crystal because it completes a pixel array including a thin film transistor by preparing each layer of thin film pattern on a glass substrate. With a five-layer thin film pattern process as an example, according to a sequential order of film formation, it includes: a manufacture procedure of a first metal layer, a manufacture procedure of a semiconductor, a manufacture procedure of a second metal layer, a manufacture procedure of a passivation layer, and a manufacture procedure of a transparent electrode. During a process of manufacturing each layer of thin film of an array substrate, it is functionally divided into a conductive thin film and a functional thin film, where the conductive thin film includes a metal thin film and a transparent tin indium oxide. It is known by an inventor that a metal thin film is deposited by using magnetron sputtering, and the metal thin film is subject to exposure, image developing and etching to form a metal layer with various patterns.

Some patterns in the manufacture procedure of the second metal layer (M2) are overlapped with some patterns in the manufacture procedure of the first metal layer (M1). In the M2 manufacture procedure, from a pattern not overlapped with the M1 manufacture procedure to an overlapped pattern, there is a climbing process, and a climbing position has an impact on the stability of a line.

SUMMARY

The present application provides a display panel with a uniform display effect, a manufacture method and a display apparatus.

To this end, the present application discloses a display panel, which includes a first substrate; the first substrate includes: a base; a first metal layer formed on the base; a second metal layer; and an insulating layer, disposed between the first metal layer and the second metal layer; the first metal layer and the second metal layer are insulated; the second metal layer includes horizontal zones and oblique zones; each of the oblique zones is inclined from a first height to a second height; the first height is greater than the second height; a thickness of each of the horizontal zones of the second metal layer is greater than a thickness of each of the oblique zones of the second metal layer; and a width of each of the oblique zones of the second metal layer is greater than a width of each of the horizontal zones of the second metal layer.

Optionally, an included angle between each of the oblique zones of the second metal layer and a plane where the base is located is $\theta1$; and an included angle between the first metal layer and the plane where the base is located is $\theta2$, where $\theta1=\theta2$.

Optionally, an included angle between each of the oblique zones of the second metal layer and a plane where the base is located is $\theta1$; and an included angle between the first metal layer and the plane where the base is located is $\theta2$, where $\theta1 \neq \theta2$.

Optionally, the width of each of the oblique zones of the second metal layer is d6, and the width of each of the horizontal zones of the second metal layer is d5, where $$d5 = \frac{d6}{\cos\theta1}.$$

Optionally, the horizontal zones of the second metal layer include a first zone, a second zone and a top horizontal zone; the top horizontal zone is as high as the first height; the first zone and the second zone are as high as the second height; and a thickness of the second metal layer in each of the first zone, the second zone, and a third zone is equal.

Optionally, the thickness of each of the oblique zones of the second metal layer is d3; the thickness of each of the horizontal zones of the second metal layer is d2; a length of the second metal layer is L;

$$d2 = \frac{V}{L}, d3 = \frac{V^*\cos\theta1}{L},$$

and d2>d3, where the V is a volume of the second metal layer in a vertical direction in a unit time when the second metal layer is formed.

Optionally, the oblique zones of the second metal layer include a first oblique zone and a second oblique zone; the horizontal zones of the second metal layer include a top horizontal zone; the top horizontal zone is corresponding to a position of the first metal layer; the first oblique zone is located at one side of the top horizontal zone; the second oblique zone is located at the other side of the top horizontal zone; a width of the first oblique zone is greater than the width of each of the horizontal zones of the second metal layer; and a width of the second oblique zone is greater than the width of each of the horizontal zones of the second metal layer.

Optionally, the horizontal zones of the second metal layer include a first zone, a second zone and a top horizontal zone; the top horizontal zone is as high as the first height; the first zone and the second zone are as high as the second height; the first zone includes a first adjoining zone and a first wiring zone; the first adjoining zone is connected with the first oblique zone; the first wiring zone is far away from the first oblique zone; and widths of the first adjoining zone and the first oblique zone are equal and are greater than a width of the first wiring zone.

Optionally, the horizontal zones of the second metal layer include a first zone, a second zone and a top horizontal zone; the top horizontal zone is as high as the first height; the first zone and the second zone are as high as the second height; the top horizontal zone includes a second adjoining zone and a middle zone; the second adjoining zone is connected with the first oblique zone; the middle zone is far away from the first oblique zone; and widths of the second adjoining zone and the first oblique zone are equal and are greater than a width of the middle zone.

Optionally, the horizontal zones of the second metal layer include a first zone, a second zone and a top horizontal zone; the top horizontal zone is as high as the first height; the first zone and the second zone are as high as the second height; the second zone includes a third adjoining zone and a second wiring zone; the third adjoining zone is connected with the second oblique zone; the second wiring zone is far away from the second oblique zone; and widths of the third adjoining zone and the second oblique zone are equal and are greater than a width of the second wiring zone.

Optionally, the horizontal zones of the second metal layer include a first zone, a second zone and a top horizontal zone; the top horizontal zone is as high as the first height; the first zone and the second zone are as high as the second height; the top horizontal zone includes a fourth adjoining zone and a middle zone; the fourth adjoining zone is connected with the second oblique zone; the middle zone is far away from the second oblique zone; and widths of the fourth adjoining zone and the second oblique zone are equal and are greater than a width of the middle zone.

The present application further discloses a manufacture method of a display panel, which includes:

a step of forming a first substrate, where the step of forming a first substrate includes:

forming a first metal layer on a base; forming an insulating layer on the first metal layer; and forming a second metal layer on the insulating layer, where the second metal layer includes horizontal zones and oblique zones, each of the formed oblique zones is inclined from a first height to a second height, the first height is greater than the second height, a thickness of each of the formed horizontal zones is greater than a thickness of each of the formed oblique zones, and a width of each of the formed oblique zones is greater than a width of each of the formed horizontal zones.

Optionally, in the step of forming the second metal layer on the insulating layer, the second metal layer including the horizontal zones and the oblique zones, the width of each of the oblique zones of the second metal layer is d6, and the width of each of the horizontal zones of the second metal layer is d5, $$d5 = \frac{d6}{\cos\theta 1}.$$

The present application further discloses a display apparatus, which includes the above-mentioned display panel.

In this solution, since the thickness of each of the horizontal zones of the second metal layer is greater than the thickness of each of the oblique zones of the second metal layer, a resistance of each of the oblique zones is greater than a resistance of each of the horizontal zones; by setting the width of each of the oblique zones of the second metal layer to be greater than the width of each of the horizontal zones of the second metal layer, an area of each of the oblique zones of the second metal layer in the first metal layer is increased; a large thickness is corresponding to a small width, thereby being supplementary to each other; by increasing a width of an oblique zone with a small thickness, cross-sectional areas of two oblique zones are equal or are approximately equal; and under a condition in which a conductivity P and a unit length L of a resistive material are equal or are approximately equal, resistances of the horizontal zones and vertical zones are equal or are approximately equal at last, and thus a line resistance is kept uniform and stable, and the display effect of the display panel is more uniform.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

It should be understood that the terms used herein and the specific structure and function details disclosed herein are merely for describing specific embodiments and are representative. However, the present application can be specifically embodied in many alternative forms, and should not be interpreted to be limited to the embodiments described herein.

In the description of the present application, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more features unless otherwise stated; and "a plurality of" means two or more. The term "include" and any variations thereof are intended to cover a non-exclusive inclusion, and may have the presence or addition of one or more other features, integers, steps, operations, elements, components and/or combinations thereof.

In addition, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application.

Besides, unless otherwise specified and defined, the terms "install", "connected with", "connected to" should be comprehended in a broad sense. For example, these terms may be comprehended as being fixedly connected, detach ably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The present application will be described below with reference to accompanying drawings and optional embodiments.

In a TFT-LCD, an array manufacture engineering is a key engineering to implement electrical drive of a crystal because it completes a pixel array including a thin film transistor by preparing each layer of thin film pattern on a glass substrate. With a 5-layer thin film pattern process as an example, according to a sequential order of film formation, it includes: a manufacture procedure of a first metal layer (abbreviated as an M1 manufacture procedure), a manufacture procedure of a semiconductor (abbreviated as an AS manufacture procedure), a manufacture procedure of a second metal layer (abbreviated as an M2 manufacture procedure), a manufacture procedure of a passivation layer (abbreviated as a PV manufacture procedure), and a manufacture procedure of a transparent electrode (abbreviated as an ITO manufacture procedure). The M1 manufacture procedure forms a pattern relevant to a scanning line, the AS manufacture procedure forms a pattern of a TFT channel, the M2 manufacture procedure forms a pattern relevant to a data line, the PV manufacture procedure forms a pattern of a contact hole, and the ITO manufacture procedure forms a pattern of a pixel electrode. During a process of manufacturing each layer of thin film of an array substrate, it is functionally divided into a conductive thin film and a functional thin film, where the conductive thin film includes a metal thin film and a transparent ITO. The metal thin film is subject to exposure, image developing and etching to form a metal layer with various patterns.

It is known by an inventor that the metal thin film is deposited by using magnetron sputtering. The magnetron sputtering is to increase a magnetic field nearby a back of a target material on the basis of secondary direct-current sputtering. A sputtering process from the target material to a surface of the substrate may be viewed as a straight forwarding process.

Figure 1:
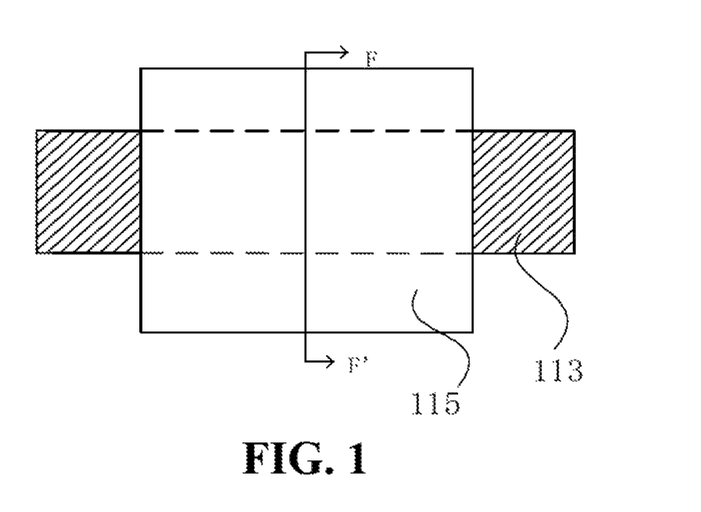
FIG. 1 is a schematic diagram of a top view of a first metal layer and a second metal layer in an embodiment of the present application.
Figure 2:
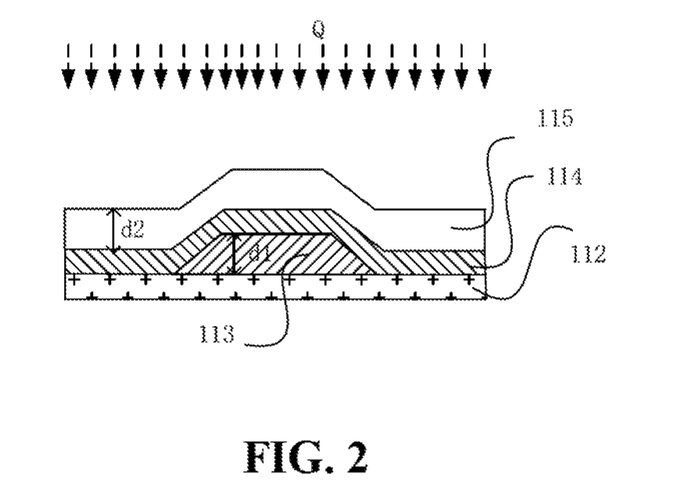
FIG. 2 is a schematic diagram of a cross-sectional view along an F-F direction in FIG. 1.

The M1 manufacture procedure is the manufacture procedure of the first metal layer, and the M2 manufacture procedure is the manufacture procedure of the second metal layer. Some patterns in the M2 manufacture procedure are overlapped with some patterns in the M1 manufacture procedure. In the M2 manufacture procedure, from a pattern not overlapped with the M1 manufacture procedure to an overlapped pattern, there is a climbing process, as shown in FIG. 1 and FIG. 2. It may be seen from FIG. 1 that a thickness of a thin film pattern in a climbing zone is not smaller than a thickness of a thin film in a non-climbing zone, which lies in that when the magnetron sputtering in the M2 manufacture procedure is performed, a sputtering volume flow of a coating film in a vertical direction in the M2 manufacture procedure is Q, where the d1 is a thickness of the first metal layer, and a horizontal effective film coating area in the climbing zone is smaller than the climbing area. In a case where a same line width is kept for climbing in M2, a resistance is increased at a climbing position, which has a huge impact on keeping a line resistance uniform and stable, particularly the data line.

Herein, the d2 is a thickness of each of horizontal zones of the second metal layer, the d3 is a thickness of each of oblique areas of the second metal layer, the d4 is a first oblique zone, the d7 is a first adjoining zone, the d8 is a second adjoining zone, the d14 is a third adjoining zone, the d12 is a second oblique zone, and the d13 is a fourth adjoining zone.

As shown in FIG. 3 to FIG. 10, in one or more embodiments of the present application discloses a display panel 110, which includes a first substrate 111; the first substrate 111 includes: a base 112; a first metal layer 113 formed on the base 112; a second metal layer 115; and an insulating layer 114, disposed between the first metal layer 113 and the second metal layer 115; the first metal layer 113 and the second metal layer 115 are insulated; the second metal layer 115 includes horizontal zones 116 and oblique zones 117; each of the oblique zones 117 is inclined from a first height 130 to a second height 131; the first height 130 is greater than the second height 131; a thickness of each of the horizontal zones 116 of the second metal layer 115 is greater than a thickness of each of the oblique zones 117 of the second metal layer 115; and a width of each of the oblique zones 117 of the second metal layer 115 is greater than a width of each of the horizontal zones 116 of the second metal layer 115.

In this solution, since the thickness of each of the horizontal zones 116 of the second metal layer 115 is greater than the thickness of each of the oblique zones 117 of the second metal layer 115, a resistance of each of the oblique zones 117 is greater than a resistance of each of the horizontal zones 116; by setting the width of each of the oblique zones 117 of the second metal layer 115 to be greater than the width of each of the horizontal zones 116 of the second metal layer 115, an area of each of the oblique zones of the second metal layer 115 in the first metal layer 113 is increased; a large thickness is corresponding to a small width, thereby being supplementary to each other; by increasing a width of an oblique zone with a small thickness, cross-sectional areas of two oblique zones are equal or are approximately equal; and under a condition in which a conductivity and a unit length L of a resistive material are equal or are approximately equal, resistances of the horizontal zones 116 and vertical zones are equal or are approximately equal at last, and thus a line resistance is kept uniform and stable, and the display effect of the display panel 110 is more uniform.

Figure 3:
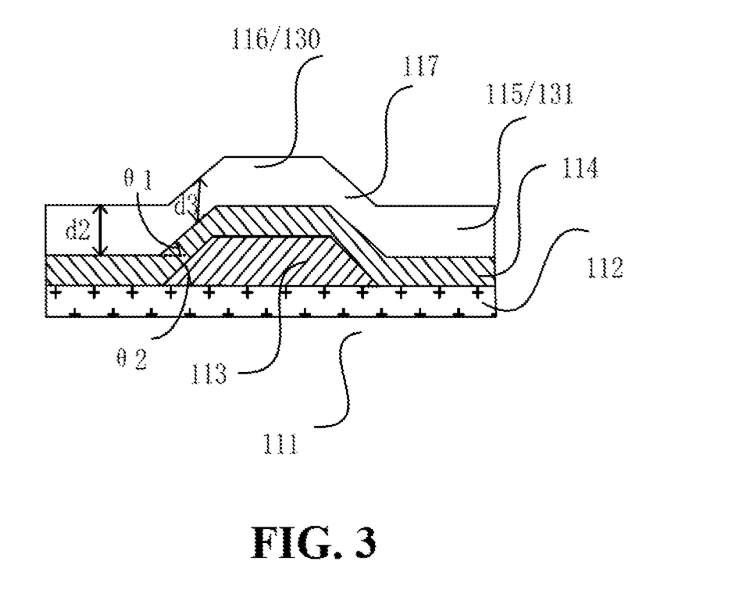
FIG. 3 is a schematic diagram of a cross-sectional view of a display panel in an embodiment of the present application.

As shown in FIG. 3, in one or more embodiments, an included angle between each of the oblique zones of the second metal layer 115 and a plane where the base 112 is located is θ1; and an included angle between the first metal layer 113 and the plane where the base 112 is located is θ2, where θ1=θ2.

In this solution, the included angle between each of the oblique zones of the second metal layer 115 and the plane where the base 112 is located is θ1, and the included angle between the first metal layer 113 and the plane where the base 112 is located is θ2, where θ1=θ2. As a result, line widths of the oblique zones of the second metal layer 115 are parallel and the overall thickness is uniform; and with the equal thickness, how much the width of each of the oblique zones is increased may be calculated and thus the resistance of each of the oblique zones is controlled for the convenience of calculation. Certainly, the two included angles may also not be equal, i.e., θ1≠θ2. Each of the angles is not be defined as long as line resistances of the oblique zones and the horizontal zones 116 may be kept uniform and stable.

Figure 4:
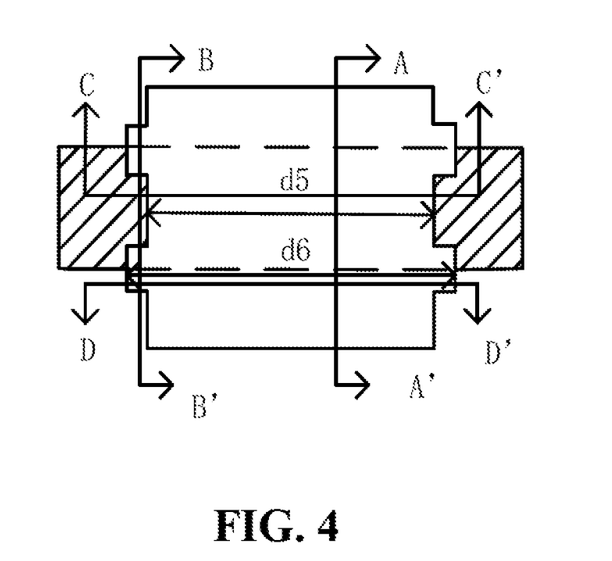
FIG. 4 is a schematic diagram of a top view of a display panel in an embodiment of the present application.
Figure 5:
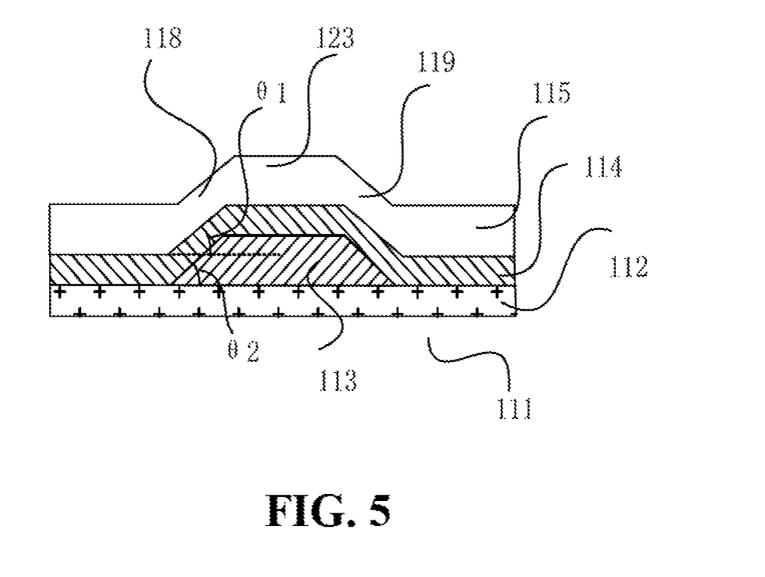
FIG. 5 is a schematic diagram of a cross-sectional view along an A-A' direction in FIG. 4.
Figure 6:
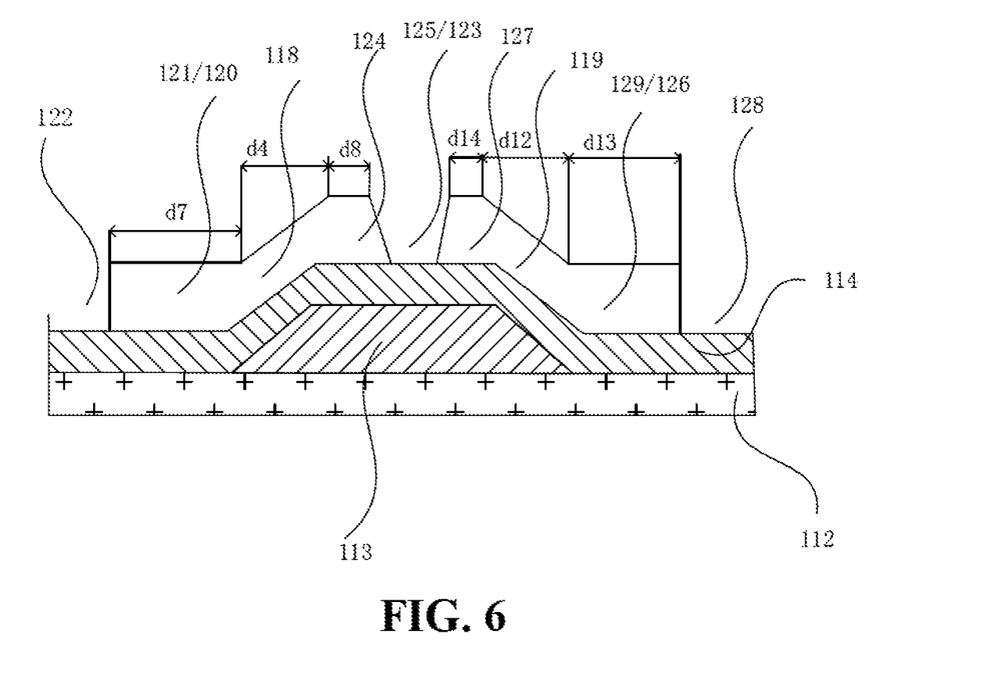
FIG. 6 is a schematic diagram of a cross-sectional view along a B-B' direction in FIG. 4.
Figure 7:
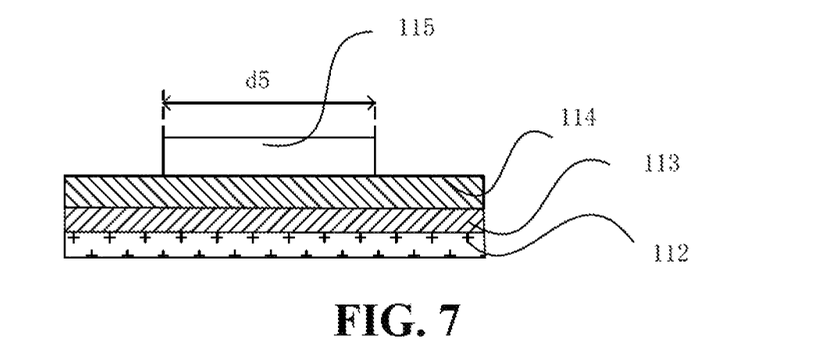
FIG. 7 is a schematic diagram of a cross-sectional view along a C-C' direction in FIG. 4.
Figure 8:
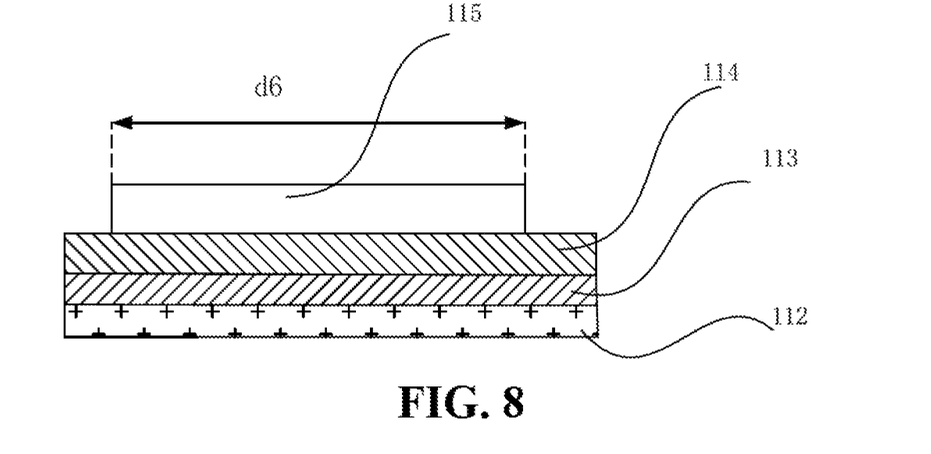
FIG. 8 is a schematic diagram of a cross-sectional view along a D-D' direction in FIG. 4.

As shown in FIG. 4, in one or more embodiments, the width of each of the oblique zones of the second metal layer 115 is d6, and the width of each of the horizontal zones 116 of the second metal layer 115 is d5, where a following formula is met:

$$d5 = \frac{d6}{\cos\theta1}.$$

In this solution, the width of each of the oblique zones of the second metal layer 115 is d6, the thickness of each of the horizontal zones 116 of the second metal layer 115 is d5, and a relationship between the d5 and the d6 meets the formula:

$$d5 = \frac{d6}{\cos\theta1},$$

where the d5 is greater than the d6. Under a condition in which the thickness is not changed, by increasing the width of each of the oblique zones of the second metal layer 115, the area of each of the oblique zones of the second metal layer 115 is increased, and the resistance of each of the oblique zones in a unit length is consistent with the resistance of each of the horizontal zones 116 in a unit length; and thus, the resistance of each of the oblique zones is changed, the line resistance is kept uniform and stable, and the display effect of the display panel 110 is more uniform.

In one or more embodiments, the horizontal zones 116 of the second metal layer 115 include a first zone 120, a second zone 126 and a top horizontal zone 123; the top horizontal zone 123 is as high as the first height 130; the first zone 120 and the second zone 126 are as high as the second height 131; and a thickness of the second metal layer 115 in each of the first zone 120, the second zone 126, and a third zone is equal. In this solution, the horizontal zones 116 of the second metal layer 115 include the first zone 120, the second zone 126 and the top horizontal zone 123, and the thickness of each of the first zone 120, the second zone 126 and the top horizontal zone 123 is equal, so the uniformity of a film thickness of the second metal layer 115 on a horizontal direction is guaranteed, the line resistance is uniform and stable, and the display effect of the display panel 110 is more uniform.

In one or more embodiments, the thickness of each of the oblique zones of the second metal layer 115 is d3; the thickness of each of the horizontal zones 116 of the second metal layer 115 is d2; a length of the second metal layer 115 is L;

$$d2 = \frac{V}{L}, d3 = \frac{V*\cos\theta1}{L}, \text{ and } d2 > d3,$$

where the V is a volume of the second metal layer 115 in a vertical direction in a unit time when the second metal layer 115 is formed.

In one or more embodiments, the oblique zones of the second metal layer 115 include a first oblique zone 118 and a second oblique zone 119; the horizontal zones 116 of the second metal layer 115 include a top horizontal zone 123; the top horizontal zone 123 is corresponding to a position of the first metal layer 113; the first oblique zone 118 is located at one side of the top horizontal zone 123; the second oblique zone 119 is located at the other side of the top horizontal zone 123; a width of the first oblique zone 118 is greater than the width of each of the horizontal zones of the second metal layer; and a width of the second oblique zone 119 is greater than the width of each of the horizontal zones of the second metal layer.

In this solution, compared the solution in which the widths of the first oblique zone 118 and the second oblique zone 119 are increased with the solution in which the width of the oblique zone at one side is increased, by widening the oblique zones at two sides, the uniformity and the stability of an overall circuit are better, and the display effect of the display panel 110 is more uniform. Oblique included angles of the first oblique zone 118 and the second oblique zone 119 may be equal and may also not be equal. When the oblique included angles are equal, resistances of the first oblique zone 118 and the second oblique zone 119 are equal and thus the resistance of the overall second metal layer 115 is consistent; and when the oblique included angles are not equal, consistent resistance is implemented by adjusting different widths and thus the display effect of the display panel 110 is more uniform.

As shown in FIG. 5 to FIG. 8, in one or more embodiments, the horizontal zones 116 of the second metal layer 115 include a first zone 120, a second zone 126 and a top horizontal zone 123; the top horizontal zone 123 is as high as the first height 130; the first zone 120 and the second zone 126 are as high as the second height 131; the first zone 120 includes a first adjoining zone 121 and a first wiring zone 122; the first adjoining zone 121 is connected with the first oblique zone 118; the first wiring zone 122 is far away from the first oblique zone 118; and widths of the first adjoining zone 121 and the first oblique zone 118 are equal and are greater than a width of the first wiring zone 122. In this solution, by increasing the widths of the first adjoining zone 121 and the first oblique zone 118, the requirement on a precision of the process is reduced; and although the resistance is increased, the influence on the panel is little.

In one or more embodiments, the horizontal zones 116 of the second metal layer 115 include a first zone 120, a second zone 126 and a top horizontal zone 123; the top horizontal zone 123 is as high as the first height 130; the first zone 120 and the second zone 126 are as high as the second height 131; the top horizontal zone 123 includes a second adjoining zone 124 and a middle zone 125; the second adjoining zone 124 is connected with the first oblique zone 118; the middle zone 125 is far away from the first oblique zone 118; and widths of the second adjoining zone 124 and the first oblique zone 118 are equal and are greater than a width of the middle zone 125.

In one or more embodiments, the horizontal zones 116 of the second metal layer 115 include a first zone 120, a second zone 126 and a top horizontal zone 123; the top horizontal zone 123 is as high as the first height 130; the first zone 120 and the second zone 126 are as high as the second height 131; the second zone 126 includes a third adjoining zone 127 and a second wiring zone 128; the third adjoining zone 127 is connected with the second oblique zone 119; the second wiring zone 128 is far away from the second oblique zone 119; and widths of the third adjoining zone 127 and the second oblique zone 119 are equal and are greater than a width of the second wiring zone 128.

In one or more embodiments, the horizontal zones 116 of the second metal layer 115 include a first zone 120, a second zone 126 and a top horizontal zone 123; the top horizontal zone 123 is as high as the first height 130; the first zone 120 and the second zone 126 are as high as the second height 131; the top horizontal zone 123 includes a fourth adjoining zone 129 and a middle zone 125; the fourth adjoining zone 129 is connected with the second oblique zone 119; the middle zone 125 is far away from the second oblique zone 119; and widths of the fourth adjoining zone 129 and the second oblique zone 119 are equal and are greater than a width of the middle zone 125. Such a solution is also appropriate.

In order to ensure that the width d5 may be made, according to exposure characteristics of an exposure machine, values of the d4 and the d8 are at least 2 μm. Optionally, the values of the d4 and the d8 are at least 0 μm, and are no more than 10 pun. A value range of the θ1 is 5°<θ1<85°, 11.474*d6≥d5≥1.004*d6, where the d4, the d8, the d12 and the d14 all are smaller than the length of the first metal layer 113.

Figure 9:
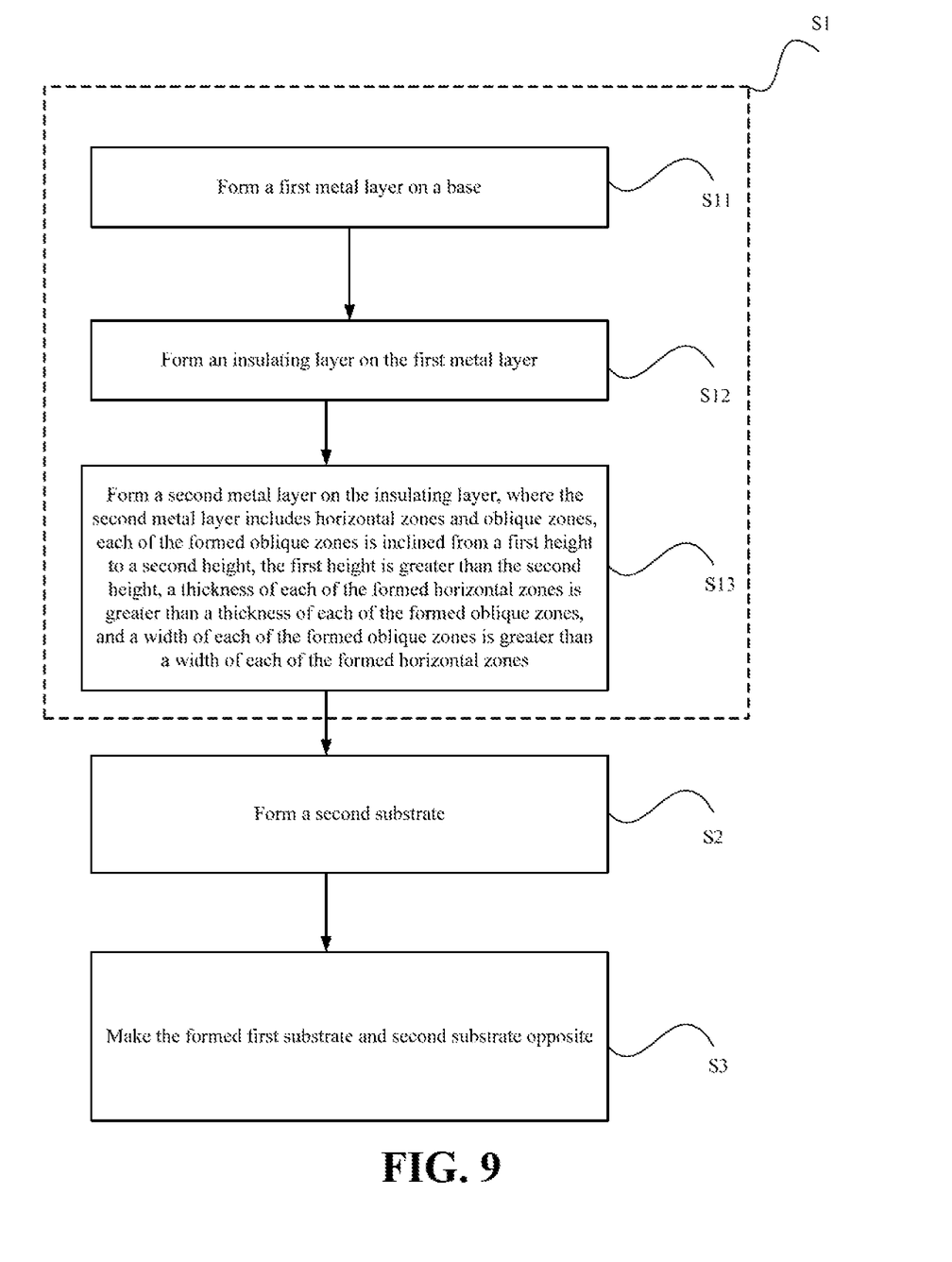
FIG. 9 is a flowchart diagram of a manufacture method of a display panel in an embodiment of the present application.

As shown in FIG. 9, an embodiment of the present application discloses a manufacture method of a display panel 110, which includes the following steps:

S1: Forming a first substrate 111;
S2: Forming a second substrate:
S3: Making the formed first substrate 111 and second substrate opposite.

The step S1 of forming a first substrate 111 includes the following steps:

S11: Forming a first metal layer 113 on a base 112;
S12: Forming an insulating layer 114 on the first metal layer 113;
S13: Forming a second metal layer 115 on the insulating layer 114, where the second metal layer 115 includes horizontal zones 116 and oblique zones; each of the formed oblique zones is inclined from a first height 130 to a second height 131; the first height 130 is greater than the second height 131; a thickness of each of the formed horizontal zones 116 is greater than a thickness of each of the formed oblique zones; and a width of each of the formed oblique zones is greater than a width of each of the formed horizontal zones 116.

A sequential order of the step S1 and the step S2 is not demanded.

In this solution, since the thickness of each of the horizontal zones 116 of the second metal layer 115 is greater than the thickness of each of the oblique zones of the second metal layer 115, a resistance of each of the oblique zones is greater than a resistance of each of the horizontal zones 116; by setting the width of each of the oblique zones of the second metal layer 115 to be greater than the width of each of the horizontal zones 116 of the second metal layer 115, an area of each of the oblique zones of the second metal layer 115 in the first metal layer 113 is increased; a large thickness is corresponding to a small width, thereby being supplementary to each other; by increasing a width of an oblique zone with a small thickness, cross-sectional areas of two oblique zones are equal or are approximately equal; and under a condition in which a conductivity P and a unit length L of a resistive material are equal or are approximately equal, resistances of the horizontal zones 116 and vertical zones are equal or are approximately equal at last, and thus a line resistance is kept uniform and stable, and the display effect of the display panel 110 is more uniform.

In one or more embodiments, in the step of forming the second metal layer 115 on the insulating layer 114, the second metal layer 115 including the horizontal zones 116 and the oblique zones, a width of each of the oblique zones of the second metal layer 115 is d6, and a width of each of the horizontal zones 116 of the second metal layer 115 is d5, $$d5 = \frac{d6}{\cos\theta 1}.$$

In this solution, the width of each of the oblique zones of the second metal layer 115 is d6, and the width of each of the horizontal zones 116 of the second metal layer 115 is d5, $$d5 = \frac{d6}{\cos\theta 1},$$

where the d5 is greater than the d6. Under a condition in which the thickness is not changed, by increasing the width of each of the oblique zones, the area of each of the oblique zones of the second metal layer 115 is increased; and thus, the resistance of each of the oblique zones is changed, and the line resistance is kept uniform and stable.

Figure 10:
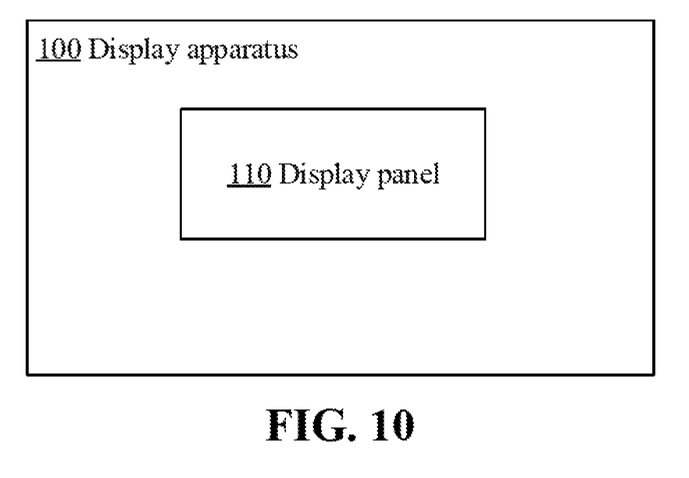
FIG. 10 is a schematic block diagram of a display apparatus in an embodiment of the present application.

As shown in FIG. 10, the present application further discloses a display apparatus 100, which includes the above-mentioned display panel 110.

The present application discloses a display panel 110, which includes a first substrate 111; the first substrate 111 includes a base 112, a first metal layer 113 formed on the base 112, a second metal layer 115, and an insulating layer 114; the insulating layer 114 is disposed between the first metal layer 113 and the second metal layer 115; the first metal layer 113 and the second metal layer 115 are insulated; the second metal layer 115 includes horizontal zones 116 and oblique zones; each of the oblique zones is inclined from a first height 130 to a second height 131; the first height 130 is greater than the second height 131; a thickness of each of the horizontal zones 116 of the second metal layer 115 is greater than a thickness of each of the oblique zones of the second metal layer 115; and a width of each of the oblique zones of the second metal layer 115 is greater than a width of each of the horizontal zones 116 of the second metal layer 115. Optionally, an included angle between each of the oblique zones of the second metal layer 115 and a plane where the base 112 is located is θ1; and an included angle between the first metal layer 113 and the plane where the base 112 is located is θ2, where θ1=θ2.

The horizontal zones 116 of the second metal layer 115 include a first zone 120, a second zone 126 and a top horizontal zone 123; the top horizontal zone 123 is as high as the first height 130; the first zone 120 and the second zone 126 are as high as the second height 131; the first zone 120 includes a first adjoining zone 121 and a first wiring zone 122; the second zone 126 includes a third adjoining zone 127 and a second wiring zone 128; the top horizontal zone 123 includes a second adjoining zone 124, a fourth adjoining zone 129 and a middle zone 125; and a width of each of the first adjoining zone 121, the second adjoining zone 124, the third adjoining zone 127 and the fourth adjoining zone 129 as well as a first oblique zone and a second oblique zone is increased.

In this solution, since the thickness of each of the horizontal zones 116 of the second metal layer 115 is greater than the thickness of each of the oblique zones of the second metal layer 115, a resistance of each of the oblique zones is greater than a resistance of each of the horizontal zones 116; by setting the width of each of the oblique zones of the second metal layer 115 to be greater than the width of each of the horizontal zones 116 of the second metal layer 115, an area of each of the oblique zones of the second metal layer 115 in the first metal layer 113 is increased; a large thickness is corresponding to a small width, thereby being supplementary to each other; by increasing a width of an oblique zone with a small thickness, cross-sectional areas of two oblique zones are equal or are approximately equal; and under a condition in which a conductivity P and a unit length L of a resistive material are equal or are approximately equal, resistances of the horizontal zones 116 and vertical zones are equal or are approximately equal at last, and thus a line resistance is kept uniform and stable, and the display effect of the display panel 110 is more uniform.

It is to be noted that, the limit on each step related in this solution is not considered as a limit to a sequential order of the steps on the premise of not affecting implementation of a specific solution. A step written in front may be executed ahead and may also be executed later, or even may also be executed simultaneously; and as long as this solution can be implemented, all should be considered as a scope of protection of the present application.

The technical solutions of the present application may be widely applied to various display panels, such as a Twisted Nematic (TN) display panel, an In-Plane Switching (IPS) display panel, a Vertical Alignment (VA) display panel and a Multi-Domain Vertical Alignment (MVA) display panel, and certainly may also be applied to other types of display panels such as an Organic Light-Emitting Diode (OLED) display panel.

The above are further detailed descriptions of the present application in combination with specific optional implementation manners and should not be deemed as that the specific implementation of the present application is only limited to these descriptions. A person of ordinary skill in the art to which the present application belongs may further make a plurality of simple deviations or replacements without departing from the concept of the present application and all should be considered as the scope of protection of the present application.

What is claimed is:
1. A display panel, comprising:
a first substrate, comprising:
a base;
a first metal layer, formed on the base;
a second metal layer; and
an insulating layer, disposed between the first metal layer and the second metal layer, the first metal layer and the second metal layer being insulated,
wherein the second metal layer comprises horizontal zones and oblique zones; each of the oblique zones is inclined from a first height to a second height; the first height is greater than the second height; a thickness of each of the horizontal zones of the second metal layer is greater than a thickness of each of the oblique zones of the second metal layer; and a width of each of the oblique zones of the second metal layer is greater than a width of each of the horizontal zones of the second metal layer;
wherein an included angle between each of the oblique zones of the second metal layer and a plane wherein the base is located is $\theta_1$; and an included angle between the first metal layer and the plane wherein the base is located is $\theta_2$, wherein $\theta_1 = \theta_2$.

2. The display panel according to claim 1, wherein the oblique zones of the second metal layer comprise a first oblique zone and a second oblique zone; the horizontal zones of the second metal layer comprise a top horizontal zone; the top horizontal zone is corresponding to a position of the first metal layer; the first oblique zone is located at one side of the top horizontal zone; the second oblique zone is located at the other side of the top horizontal zone; a width of the first oblique zone is greater than the width of each of the horizontal zones of the second metal layer; and a width of the second oblique zone is greater than the width of each of the horizontal zones of the second metal layer.

3. The display panel according to claim 2, wherein the horizontal zones of the second metal layer further comprise a first zone and a second zone; the top horizontal zone is as high as the first height; the first zone and the second zone are as high as the second height; the first zone comprises a first adjoining zone and a first wiring zone; the first adjoining zone is disposed between the first wiring zone and the first oblique zone, and the first adjoining zone is connected with each of the first wiring zone and the first oblique zone; and widths of the first adjoining zone and the first oblique zone are equal and are greater than a width of the first wiring zone.

4. The display panel according to claim 2, wherein the horizontal zones of the second metal layer further comprise a first zone and a second zone; the top horizontal zone is as high as the first height; the first zone and the second zone are as high as the second height; the top horizontal zone comprises a second adjoining zone and a middle zone; the second adjoining zone is disposed between the middle zone and the first oblique zone, and the second adjoining zone is connected with each of the middle zone and the first oblique zone; and widths of the second adjoining zone and the first oblique zone are equal and are greater than a width of the middle zone.

5. The display panel according to claim 2, wherein the horizontal zones of the second metal layer comprise a first zone and a second zone; the top horizontal zone is as high as the first height; the first zone and the second zone are as high as the second height; the second zone comprises a third adjoining zone and a second wiring zone; the third adjoining zone is disposed between the second oblique zone and the second wiring zone, and the third adjoining zone is connected with each of the second oblique zone and the second wiring zone; and widths of the third adjoining zone and the second oblique zone are equal and are greater than a width of the second wiring zone.

6. The display panel according to claim 2, wherein the horizontal zones of the second metal layer comprise a first zone, a second zone and the top horizontal zone; the top horizontal zone is as high as the first height; the first zone and the second zone are as high as the second height; the top horizontal zone comprises a fourth adjoining zone and a middle zone; the fourth adjoining zone is disposed between the second oblique zone and the middle zone, and the fourth adjoining zone is connected with each of the second oblique zone and the middle zone; and widths of the fourth adjoining zone and the second oblique zone are equal and are greater than a width of the middle zone.

7. The display panel according to claim 1, wherein the horizontal zones of the second metal layer comprise a first zone, a second zone and a top horizontal zone; the top horizontal zone is as high as the first height; the first zone and the second zone are as high as the second height; and a thickness of the second metal layer in each of the first zone, the second zone, and a third zone is equal.

8. The display panel according to claim 1, wherein the thickness of each of the oblique zones of the second metal layer is d3, and the thickness of each of the horizontal zones of the second metal layer is d2, wherein d2>d3.

9. The display panel according to claim 1, wherein a resistance of each of the oblique zones in a unit length is equal to a resistance of each of the horizontal zones in a unit length.

10. The display panel according to claim 2, wherein an oblique included angle of the first oblique zone is equal to an oblique included angle of the second oblique zone.

11. The display panel according to claim 10, wherein a resistance of the first oblique zone is equal to a resistance of the second oblique zone.

* * * * *